(12) United States Patent
Rao et al.

(10) Patent No.: US 10,361,684 B2
(45) Date of Patent: Jul. 23, 2019

(54) DUTY CYCLE DETECTION

(71) Applicant: Invecas, Inc., Santa Clara, CA (US)

(72) Inventors: Venkata N. S. N. Rao, Fremont, CA (US); Majid Jalali Far, San Jose, CA (US); Prasad Chalasani, San Jose, CA (US); Aram Martirosyan, Santa Clara, CA (US)

(73) Assignee: Invecas, Inc., Santa Clara, CA (US)

( * ) Notice: Subject to any disclaimer, the term of this patent is extended or adjusted under 35 U.S.C. 154(b) by 2 days.

(21) Appl. No.: 15/654,595

(22) Filed: Jul. 19, 2017

(65) Prior Publication Data

US 2019/0028090 A1    Jan. 24, 2019

(51) Int. Cl.
| | | |
|---|---|---|
| *H03K 3/017* | (2006.01) | |
| *H03K 5/156* | (2006.01) | |
| *H03K 9/08* | (2006.01) | |
| *G11C 7/22* | (2006.01) | |
| *H03K 19/094* | (2006.01) | |
| *H03K 19/173* | (2006.01) | |

(52) U.S. Cl.
CPC ............ *H03K 3/017* (2013.01); *H03K 5/1565* (2013.01); *H03K 9/08* (2013.01); *G11C 7/222* (2013.01); *H03K 19/09429* (2013.01); *H03K 19/1733* (2013.01)

(58) Field of Classification Search
CPC ........ H03K 3/017; H03K 9/08; H03K 5/1565; G11C 7/222
USPC .................................................. 327/175, 103
See application file for complete search history.

(56) References Cited

U.S. PATENT DOCUMENTS

| | | | | |
|---|---|---|---|---|
| 4,843,339 A | * | 6/1989 | Burt ...................... | C08F 220/04 327/94 |
| 5,025,176 A | * | 6/1991 | Takeno .................. | H03K 5/084 327/50 |
| 5,381,146 A | * | 1/1995 | Kolte ................... | G11C 27/026 327/58 |
| 5,428,307 A | * | 6/1995 | Dendinger ............. | G01R 19/04 327/60 |
| 6,208,280 B1 | | 3/2001 | Baker et al. | |
| 6,501,313 B2 | * | 12/2002 | Boerstler ............. | H03K 5/1565 327/175 |
| 6,930,588 B2 | | 8/2005 | Kaminski | |
| 6,967,514 B2 | * | 11/2005 | Kizer ................... | H03K 5/1565 327/175 |

(Continued)

OTHER PUBLICATIONS

Nakamura et al., A CMOS 50% Duty Cycle Repeater Using Complementary Phase Blending, 2000 Symposium on VLSI Circuits Digest of Technical Papers, pp. 48-49.

(Continued)

*Primary Examiner* — Ryan Jager
(74) *Attorney, Agent, or Firm* — Venture Pacific Law, PC

(57) ABSTRACT

A pulse-width-to-voltage ("PWV") converter, comprises: a switch, a capacitor, a current source, and a current sink. The switch is operable by a signal. The current source, the current sink, and the switch are serially connected across a high voltage potential and a low voltage potential. An output node is coupled to a serial connection between the current source and the current sink. An end of the capacitor is coupled to the output node for converting a current into a control voltage indicative of a duty cycle of the signal.

10 Claims, 10 Drawing Sheets

(56) References Cited

U.S. PATENT DOCUMENTS

| | | | | |
|---|---|---|---|---|
| 8,380,138 B2* | 2/2013 | Wadhwa | ............... | H03K 5/1565 |
| | | | | 327/175 |
| 9,244,485 B1* | 1/2016 | Koh | ............ | G06F 1/08 |
| 2007/0290730 A1* | 12/2007 | Dai | ............ | H03K 5/1565 |
| | | | | 327/175 |
| 2008/0150445 A1* | 6/2008 | Ichikawa | ............ | H05B 41/2882 |
| | | | | 315/219 |
| 2013/0049832 A1* | 2/2013 | Wong | ............ | H03K 3/017 |
| | | | | 327/159 |
| 2013/0093405 A1* | 4/2013 | De Cremoux | ............ | H02M 1/14 |
| | | | | 323/282 |
| 2014/0118045 A1* | 5/2014 | Lee | ............ | H03K 5/1565 |
| | | | | 327/175 |
| 2015/0244262 A1* | 8/2015 | Ouyang | ............ | H02M 3/158 |
| | | | | 323/283 |
| 2016/0109488 A1* | 4/2016 | Dearborn | ............ | H02M 3/156 |
| | | | | 324/76.11 |

OTHER PUBLICATIONS

Agarwal et al., A Duty-Cycle Correction Circuit for High-Frequency Clocks, 2006 Symposium on VLSI Circuits Digest of Technical Papers.

* cited by examiner

DUTY CYCLE DETECTION

FIELD OF INVENTION

The disclosure generally relates to duty cycle detection, and more particularly to a pulse-width-to-voltage ("PWV") converter for use in a duty cycle detector and for related applications.

BACKGROUND

Having a clock signal with 50% duty cycle is extremely important in various semiconductor technologies, including input/output double data rate ("I/O DDR") and serial/deserial ("SerDes") interface designs. The performance of logic circuits can highly depend on timings of both positive and negative edges of a clock signal. A 50% duty cycle for a clock signal is especially important in operating circuits at high speed. However, it is difficult to maintain a high-speed clock signal at 50% duty cycle after distributing that clock signal throughout an integrated circuit ("IC") system due to noise in the IC system. Additionally, the duty cycle of the clock signal cannot be guaranteed under various process, voltage, and temperature ("PVT") conditions without using additional circuitry such as duty cycle detectors and correctors to adjust the duty cycle to account for PVT errors.

Therefore, it is desirable for new methods, systems, and apparatuses for duty cycle detection to reduce PVT errors in order to achieve a proper resolution for signals used for ICs and other computing system.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein.

Figure 1:
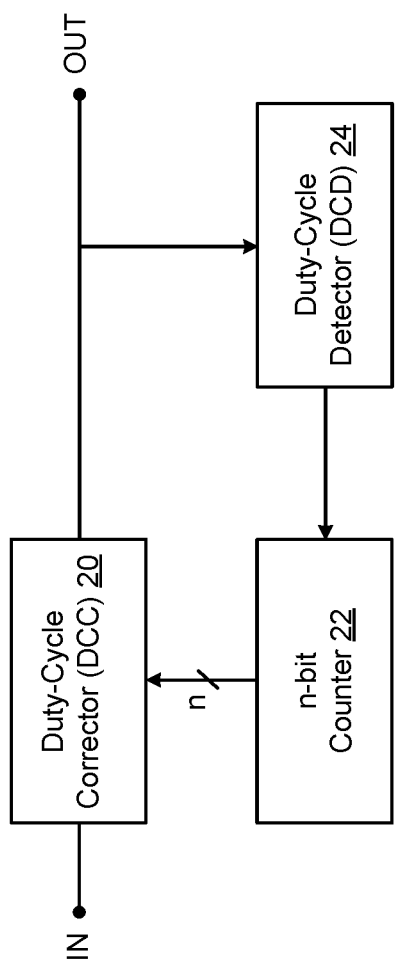
FIG. 1 illustrates a block diagram of a duty cycle adjuster of the present disclosure.

FIG. 1 illustrates a block diagram of a duty cycle adjuster of the present disclosure. A duty cycle adjuster of the present disclosure comprises a duty cycle corrector ("DCC") 20, an n-bit counter 22, and a duty cycle detector ("DCD") 24. An input signal IN (e.g., a clock signal) can be received by the DCC 20 and adjusted based on control bits from the counter 22. The DCC 20 outputs a signal OUT based on the inputted signal and the control bits. The output signal OUT can be an unchanged signal of the inputted signal or an adjusted signal, depending upon whether the duty cycle of the input signal IN varies from an ideal 50 percent (or beyond a predefined threshold from 50 percent, depending on the sensitivity of the respective system).

The DCD 24 can receive that output signal OUT to determine whether the duty cycle is at or within the predefined threshold of 50%. The DCD 24 can then output a control voltage to the counter 22 depending on whether correction of the duty cycle is needed. If the counter 22 indicates that an adjustment needs to be made, the DCC 20 can adjust the input clock's duty cycle according to the control bits from the counter 22 closer to 50% for output by adjusting rising/falling edges. The control bits applied to the DCC 20 can adjust rising and falling edges of the input clock.

Figure 2:
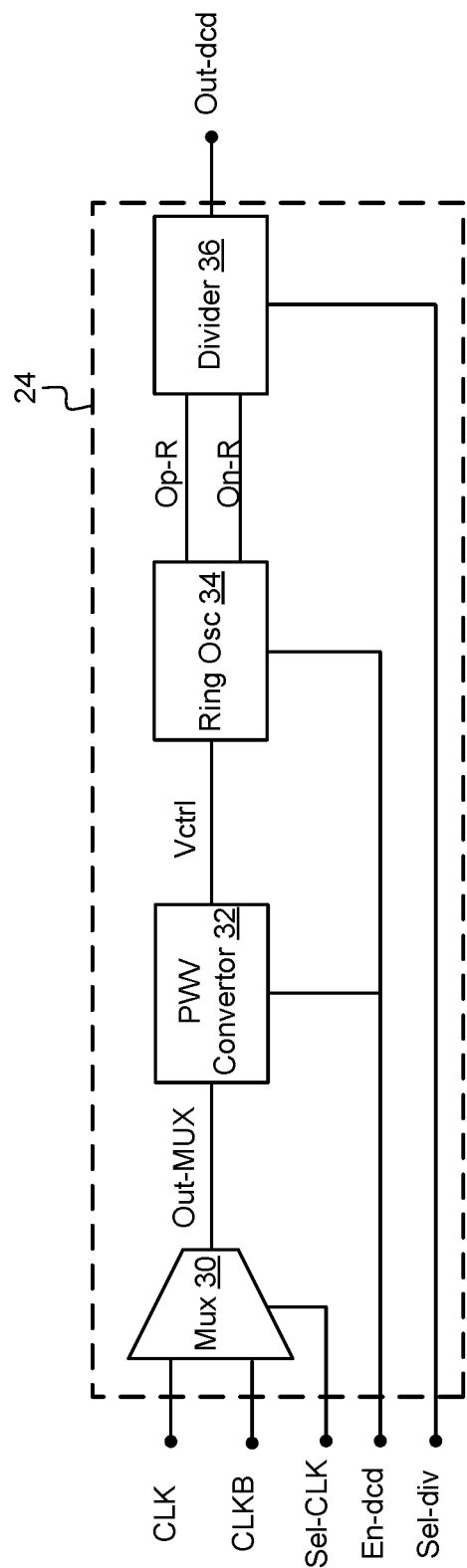
FIG. 2 illustrates a diagram of a duty cycle detector of the present disclosure.

FIG. 2 illustrates a diagram of a duty cycle detector of the present disclosure. In an embodiment, the DCD 24 can comprise a multiplexer ("mux") 30, a pulse-width-to-voltage ("PWV") converter 32, a ring oscillator 34, and an adjustable divider 36. A single clock signal from differential clock signals CLK and CLKB can be selected for output by the mux 30. A control signal Sel-CLK can be received by the mux 30 for controlling the selection. The output of the mux 30 Out-MUX is coupled to the inputs of the PWV converter 32. The PWV converter 32 converts the selected clock signal from the output of the mux 30 to a control voltage, Vctrl, to control the frequency of the ring oscillator 34. For instance, the PWV converter 32 converts the selected clock's pulse width to a current, and then the current is further converted to generate the voltage Vctrl using a capacitor element or other conversion means.

The generated voltage Vctrl is coupled to an input of the ring oscillator 34 (e.g., a 5th-stage ring oscillator). The frequency of the ring oscillator 34 depends on the selected clock signal's pulse width that is conveyed via the control voltage Vctrl. The control voltage Vctrl can vary based on a variation in the duty cycle of the selected clock signal. Thus, the oscillation frequency of the ring oscillator is effected by a change in the duty cycle of the selected clock signal since its input signal Vctrl would change accordingly. An enable signal En-dcd can be used to enable the PWV converter 32 and the ring oscillator 34. Additionally, an adjustable clock divider 36 can be utilized to divide the outputs of the ring oscillator by an integer, e.g., two or four. A control signal Sel-div can be used to select an integer to be used for the dividing.

It can be appreciated that the n-bit counter 22 can use a single input clock signal to count up and/or down cycles. Thus, the divider 36 can divide one of its input to output such a clock signal to the counter 22. It can also be appreciated that the divider 36's operation can be optional and depend on the counter structure. By using a lower frequency, lower power usage can be achieved. Also, when the frequency is decreased, a pulse width can be increased and provide for a larger unit-interval window (e.g., a bigger pulse width), which can reduce counting errors.

Figure 3:
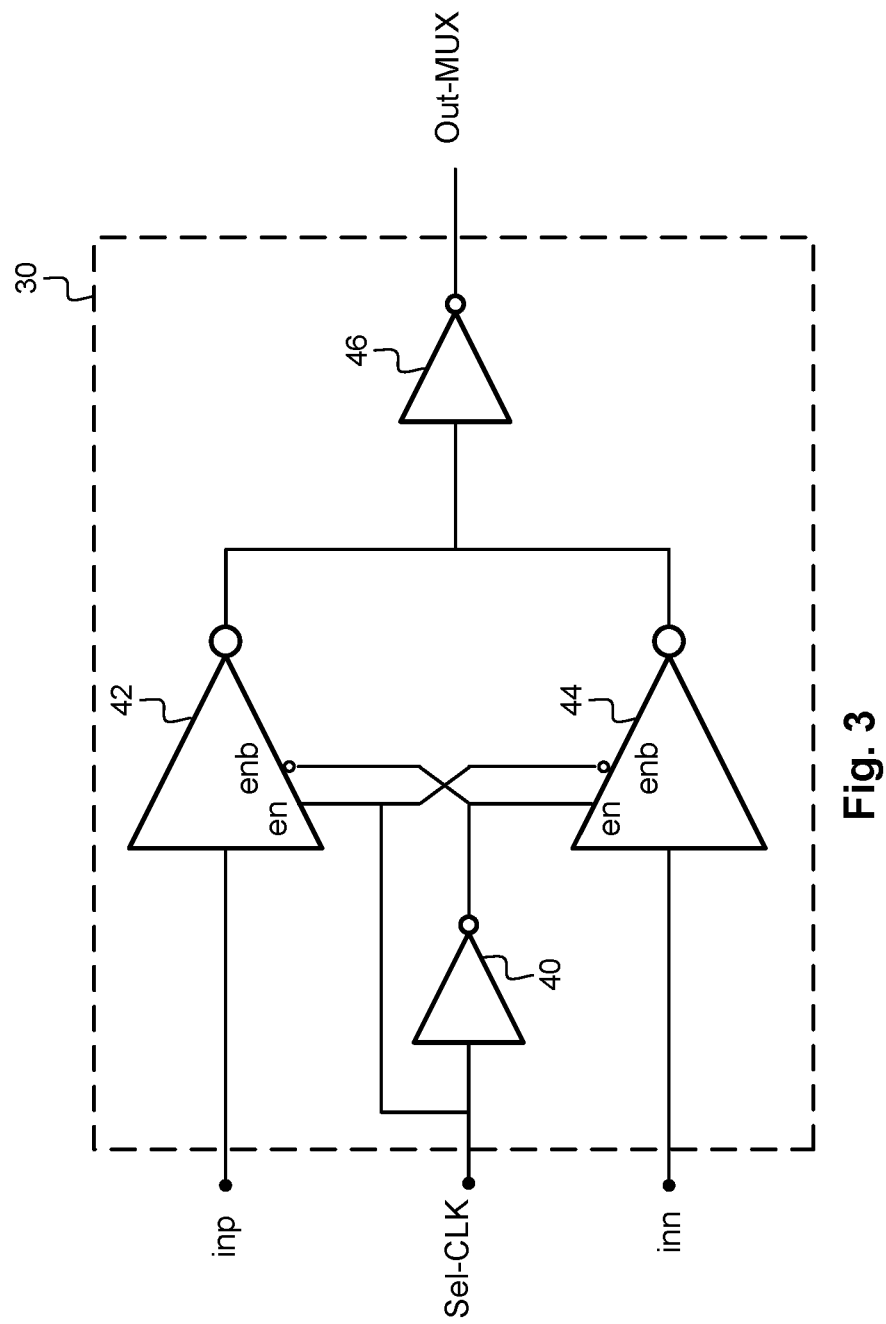
FIG. 3 illustrates a diagram of a multiplexer of the present disclosure.

FIG. 3 illustrates a diagram of a multiplexer of the present disclosure. In an embodiment, the mux 30 can comprise inverters 40-46. A control signal Sel-CLK can be used to select a first input inp or a second input inn. For instance, if the control signal Sel-CLK signal is high, then the first input inp is selected for output by the mux 30. If the control signal Sel-CLK signal is low, then the second input inn is selected for output by the mux 30. The control signal Sel-CLK is coupled to an input of the inverter 40, an enable input of inverter 42, and a disable input of inverter 44. An output of the inverter 40 is coupled to a disable input of inverter 42 and an enable input of the inverter 44. Outputs of the inverters 42 and 44 are coupled to an input of the inverter 46. An output of the inverter 46 generates the output Out-Mux. Thus, an input clock signal received by the mux 30 of the DCD 24 can be selected by the control signal Sel-CLK. It is understood by a person having ordinary skill in the art that other multiplexer implementations can be used in conjunction with the present disclosure. The embodiment of a multiplexer described herein is only meant for illustrative purposes and in no way meant to limit the present disclosure to such embodiment.

Figure 4:
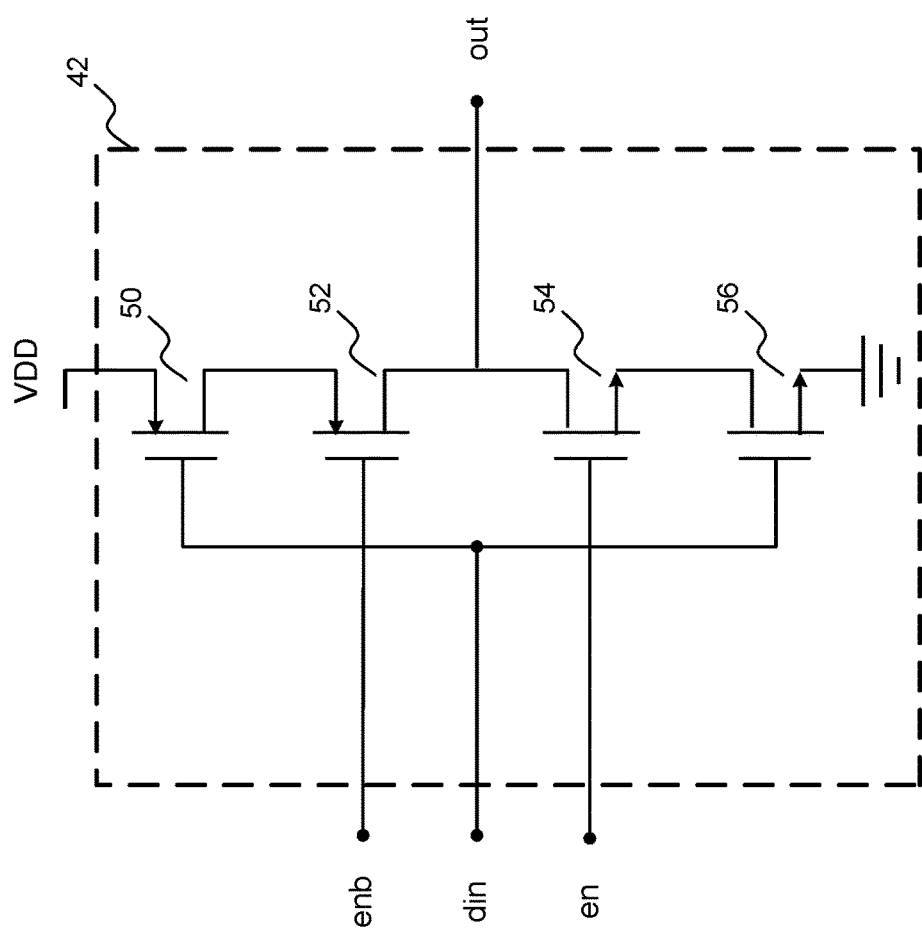
FIG. 4 illustrates a circuit diagram of a tri-state inverter used in a multiplexer of the present disclosure.

FIG. 4 illustrates a circuit diagram of an inverter used in a multiplexer of the present disclosure. In an embodiment, the mux 30 can be implemented by various inverter implementations. For instance, the inverter 42 can comprise serially-connected p-channel metal-oxide-semiconductor field effect ("PMOS") transistors 50 and 52 and n-channel metal-oxide-semiconductor field effect ("NMOS") transistors 54 and 56. The gates of the PMOS transistor 50 and the NMOS transistor 56 are coupled to an input din for the inverter 42. The disable input enb is coupled to a gate of the PMOS transistor 52. The enable input en is coupled to a gate of the NMOS transistor 54. An output can be coupled to the serial connection between the PMOS transistor 52 and the NMOS transistor 54. It is understood by a person having ordinary skill in the art that other inverter implementations can be used in conjunction with the present disclosure. The embodiment of an inverter described herein is only meant for illustrative purposes and in no way meant to limit the present disclosure to such embodiment.

Figure 5A:
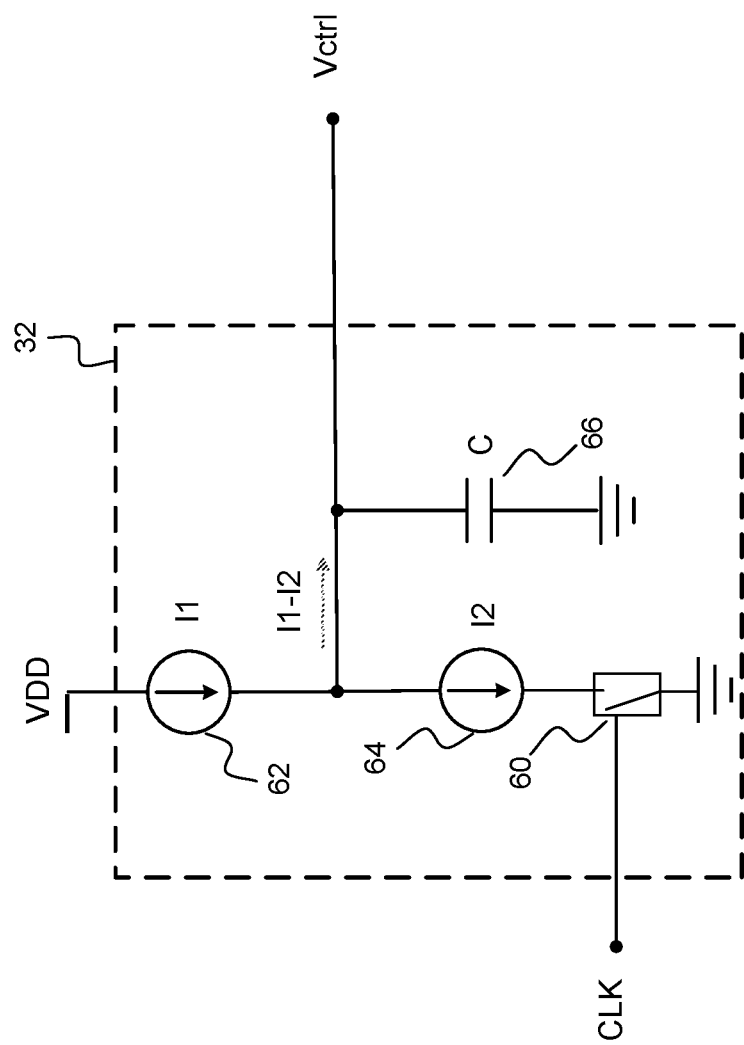
FIG. 5a illustrates a diagram of a pulse-width-to-voltage converter of the present disclosure.

FIG. 5a illustrates a diagram of a pulse-width-to-voltage converter of the present disclosure. The PWV converter 32 of the present disclosure can comprise a current source 62 for providing a current I1, a current sink 64 for providing a current sink I2, a switch 60, and a capacitor 66. The current source 62, the current sink 64, and the switch 60 are serially connected across a high voltage rail VDD and a low voltage rail, e.g., ground. The switch 60 can be implemented by an NMOS transistor. The switch 60 is coupled to a clock signal for operating the switch 60. For instance, in an NMOS transistor example, the clock signal is coupled to the gate of the NMOS transistor. The capacitor 66 has a first end coupled between the serial connection of the current source 62 and the current sink 64. An output can also be coupled to the serial connection between the current source 62 and the current sink 64 for generating a control voltage Vctrl. The capacitor 66 can have a second end coupled to the low voltage rail.

Theoretically, subtracting the sink current with the source current can aid in mitigating temperature variations (and possibly other PVT variations) in generating the control voltage to adjust the frequency of an oscillator within the DCD 24.

Referring to FIG. 5a, a drain current of a transistor in saturation is:

$$In = \frac{1}{2}\mu_n C_{ox}\left(\frac{W}{L}\right)_n (V_{GS} - V_T)^2 (1 + \lambda V_{DS}), nMOS \quad \text{EQ [1]}$$

$$Ip = \frac{1}{2}\mu_p C_{ox}\left(\frac{W}{L}\right)_p (|V_{GS}| - |V_T|)^2 (1 + \lambda |V_{DS}|), pMOS \quad \text{EQ [2]}$$

Using long channel length modulation transistors in current mirrors can reduce the effect of $\hbar$. Simplified equation for Eq [1] and EQ [2] can be rewritten, respectively, as the following:

$$In = \frac{1}{2}\mu_n C_{ox}\left(\frac{W}{L}\right)_n (V_{GS} - V_T)^2 \quad \text{EQ [3]}$$

$$Ip = \frac{1}{2}\mu_p C_{ox}\left(\frac{W}{L}\right)_p (|V_{GS}| - |V_T|)^2 \quad \text{EQ [4]}$$

Mobility ("$\mu$") and threshold voltage ("$V_T$") depend on temperature variation such that:

$$\mu(T) = \mu_0(T/T_0)^{\alpha_\mu} \text{ where } \alpha_\mu \approx -1.3 \quad \text{EQ [5]}$$

$$V_T(T) = V_{T0} + \alpha_{V_T}(T - T_0) \text{ where } \alpha_{V_T} \approx -3 \text{ mV/C}, \quad \text{EQ [6]}$$

where T0 can be a nominal temperature. The equations illustrate that a threshold voltage and mobility are degraded by increasing temperature.

In particular, an equation for a current can be written as:

$$I(T) = \frac{1}{2}C_{ox}\frac{W}{L}(\mu_0(T/T_0)^{\alpha_\mu})(V_{GS} - V_{T0} - \alpha_{V_T}(T - T_0))^2. \quad \text{EQ [7]}$$

Thus, in a set up as illustrated in FIG. 5a, current can be rewritten as the following:

$$Ip1(T) - In2(T) = \quad \text{EQ [8]}$$
$$\frac{1}{2}C_{ox}\left(\frac{W}{L}\right)_p \left(\mu_{p0}\left(\frac{T}{T_0}\right)^{\alpha_\mu}\right)(|V_{GS}| - |V_{T0} + \alpha_{V_T}(T - T_0)|)^2 -$$
$$\frac{1}{2}C_{ox}\left(\frac{W}{L}\right)_n \left(\mu_{n0}\left(\frac{T}{T_0}\right)^{\alpha_\mu}\right)(V_{GS} - V_{T0} - \alpha_{V_T}(T - T_0))^2$$

In room temperature Si, the electron mobility is $\mu_n$=1350 cm$^2$/V·s and the hole mobility is $\mu_p$=480 cm$^2$/V·s. If NMOS mobility is assumed to be three times of PMOS mobility ($\mu_{n0}$=3$\mu_{p0}$) and feature size the PMOS transistor will be M times of NMOS one, $(W/L)_p$=M$(W/L)_n$, then EQ [8] can be simplified to the following:

$$Ip1(T) - In2(T) = \quad \text{EQ [9]}$$
$$\frac{1}{2}C_{ox}\left(\frac{W}{L}\right)_n \left(\mu_{p0}\left(\frac{T}{T_0}\right)^{\alpha_\mu}\right)[M(|V_{GS}| - |V_{T0} + \alpha_{V_T}(T - T_0)|)^2 -$$
$$3(V_{GS} - V_{T0} - \alpha_{V_T}(T - T_0))^2]$$

By further assuming Vsg(PMOS)≈Vgs(NMOS) and $V_{T0}$(PMOS)≈$V_{T0}$(NMOS), $\alpha_{V_T}$≈−3 mV/C and $\alpha_\mu$≈−1.3, a voltage equation can be written as the following:

$$IR_{new} = Ip1(T) - In2(T) \approx \qquad \text{EQ [10]}$$
$$\frac{1}{2}C_{ox}\left(\frac{W}{L}\right)_n (M-3)\left(\mu_{p0}\left(\frac{T}{T_0}\right)^{1.3}\right)(|V_{GS}| - |V_{T0}| + \alpha_{V_T}(T-T_0))^2$$

Figure 5B:
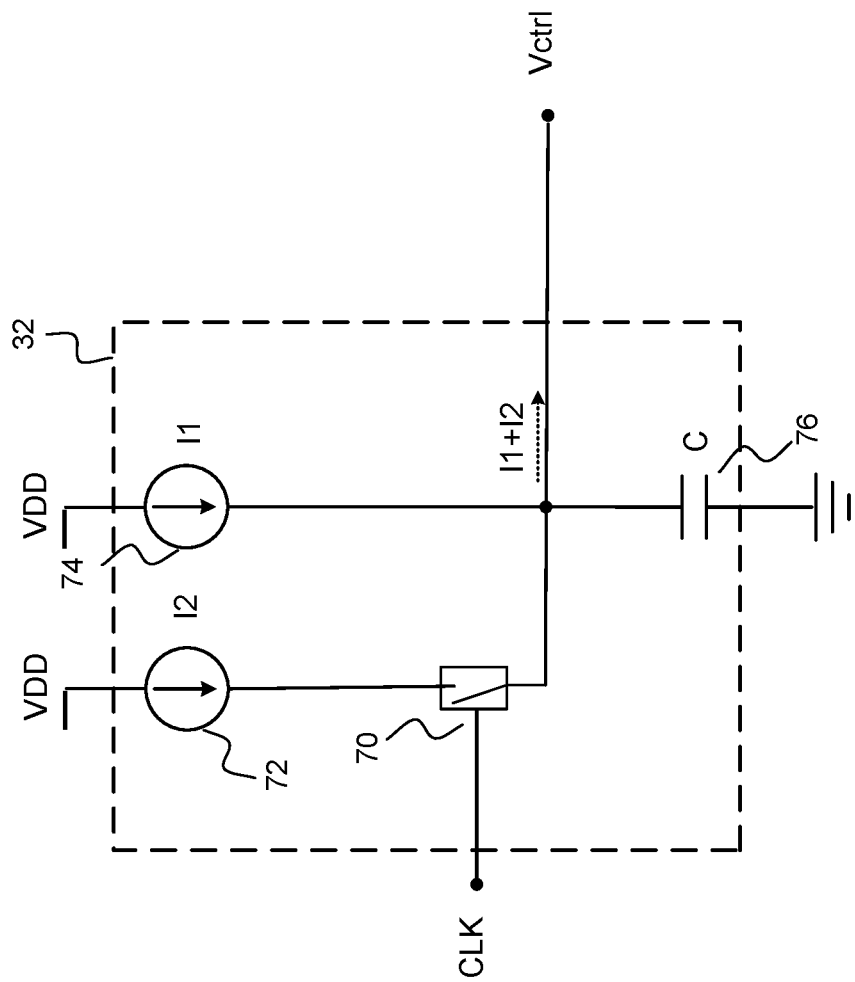
FIG. 5b illustrates a diagram of yet another pulse-width-to-voltage converter of the present disclosure.

FIG. 5b illustrates a diagram of yet another pulse-width-to-voltage converter of the present disclosure. In another embodiment, the PWV converter 32 of the present disclosure can comprise a first current source 72 for providing a current I2, a second current source 74 for providing a current I1, a switch 70, and a capacitor 76. The first current source 72, the switch 70, and the capacitor 76 are serially connected across a high voltage rail VDD and a low voltage rail, e.g., ground. The switch 70 can be implemented by an NMOS transistor (or other switching means). The switch 70 is operated by a clock signal CLK. For instance, in an NMOS transistor example, the clock signal is coupled to the gate of the NMOS transistor. The capacitor 76 has a first end coupled between the serial connection of the second current source 74 and the switch 70. The capacitor 76 can have a second end coupled to the low voltage rail. An output coupled to the serial connection between the second current source 72 and the switch 70 can be used to output a control voltage Vctrl.

Figure 6:
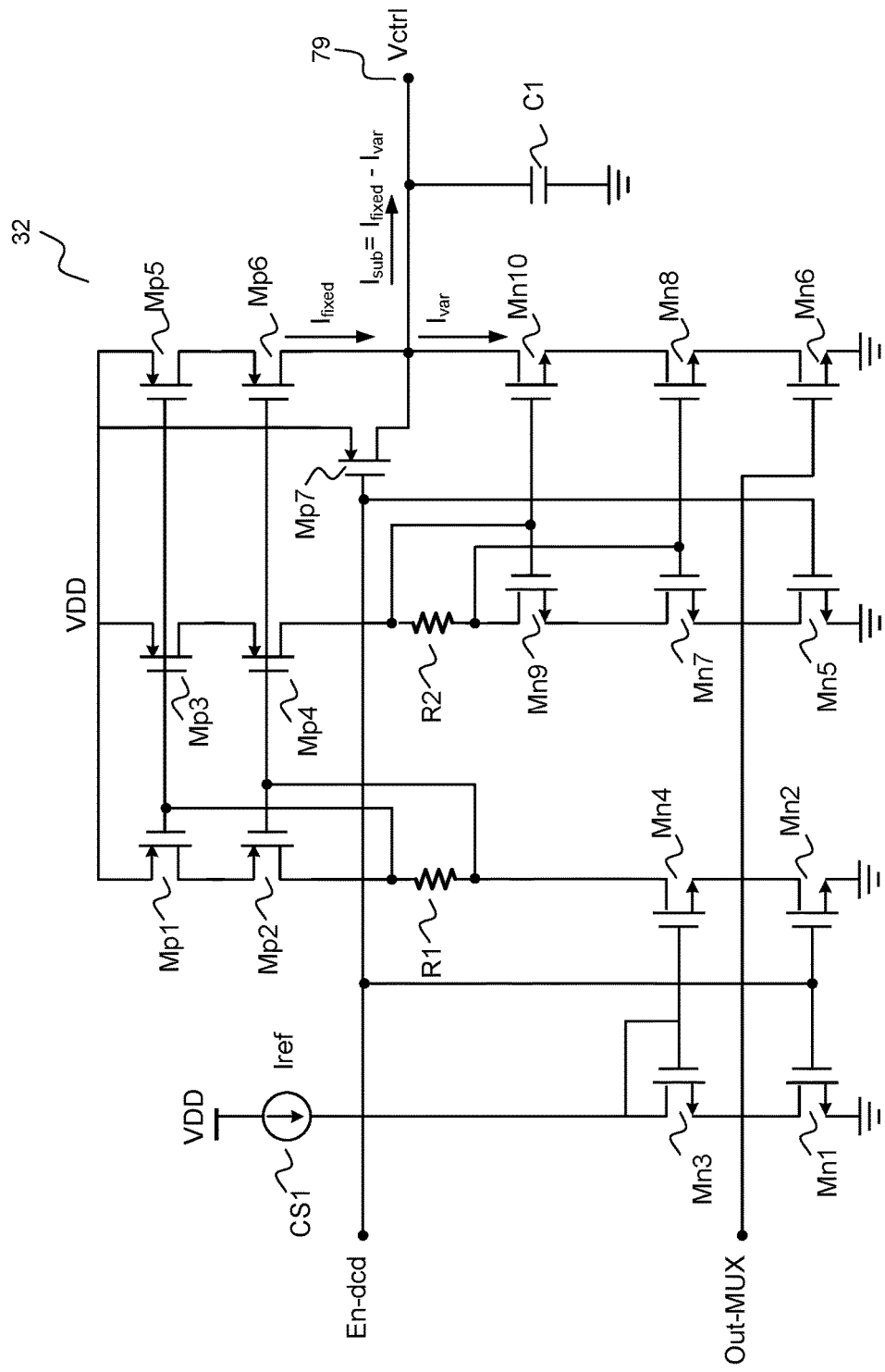
FIG. 6 illustrates a circuit diagram of a pulse-width-to-voltage converter of the present disclosure.

FIG. 6 illustrates a circuit diagram of a pulse-width-to-voltage converter of the present disclosure. A PWV converter of the present disclosure comprises a means for generating a source current $I_{fixed}$, a means for generating a sink current $I_{var}$ that is dependent on a switching means operated by a clock signal (or other selected signal), and a means for converting a current $I_{sub}$ to a voltage Vctrl. The PWV converter of the present disclosure can further comprise a means for disabling the PWV via a control signal En-dcd.

In an embodiment of the present disclosure and referring to FIG. 6, the PWV converter comprises a reference current source CS1, PMOS transistors Mp1-Mp7, NMOS transistors Mn1-Mn10, resistors R1 and R2, and a capacitor C1. The reference current source CS1, the PMOS transistors Mp1-Mp6, the resistors R1 and R2, and the NMOS transistors Mn3, Mn4, and Mn7-Mn10 are disposed in a cascode current mirror structure for generating the source current and the sink current. The NMOS transistor Mn6 provides a means for switching based on a received signal Out-MUX (e.g., a selected signal from the mux 30). The capacitor C1 provides a means for converting a current $I_{sub}$ to a control voltage Vctrl. An enable signal En-dcd can be coupled to gates of the NMOS transistors Mn1, Mn2, and Mn5 and of the PMOS transistor Mp7 to provide a means for enabling or disabling the PWV converter.

The current source CS1 and the NMOS transistors Mn3 and Mn1 are serially connected across a high voltage potential VDD and a low voltage potential (e.g., ground). The PMOS transistors Mp1 and Mp2, the resistor R1, and the NMOS transistors Mn4 and Mn2 are serially connected across the high voltage potential and the low voltage potential. The gates of the NMOS transistors Mn1 and Mn2 are coupled to the enable signal En-dcd. The gates of the NMOS transistors Mn3 and Mn4 are coupled together and further coupled to the serial connection between the current source CS1 and the NMOS transistor Mn3. A first end of the resistor R1 that is serially connected to the PMOS transistor Mp2 is further coupled to the gates of the PMOS transistors Mp1, Mp3, and Mp5. A second end of the resistor R1 that is serially connected to the NMOS transistor Mn4 is further coupled to the gates of the PMOS transistors Mp2, Mp4, and Mp6. The PMOS transistors Mp5 and Mp6 are serially connected across the high voltage potential VDD and an output node 78 for generating a source current $I_{fixed}$.

The PMOS transistors Mp3 and Mp4, the resistor R2, and NMOS transistors Mn9, Mn7, and Mn5 are serially connected across the high voltage potential and the low voltage potential. The NMOS transistors Mn10, Mn8, and Mn6 are serially connected across the output node 78 and the low voltage potential for generating the sink current Ivar. The gate of Mn6 is coupled to the inputted signal Out-MUX, e.g., from the output of the mux 30. A first end of the resistor R2 that is serially connected to the PMOS transistor Mp4 is coupled to the gates of the NMOS transistors Mn9 and Mn10. A second end of the resistor R2 that is serially connected to the NMOS transistor Mn9 is further coupled to the gates of the NMOS transistors Mn7 and Mn8.

The PMOS transistor Mp7 is coupled across the high voltage potential and the output node 79. The gate of the PMOS transistor Mp7 is coupled to the enable signal En-dcd. The capacitor C1 has one end coupled to the output node 79 and another end coupled to the low voltage potential for converting the $I_{sub}$ current to the control voltage Vctrl.

Operationally, the reference current $I_{ref}$ can be injected by the current source CS1, which is mirrored by using current mirror transistors Mn3 and Mn4. To reduce the effect of temperature on the mirrored current, a sink and source current are made by using cascode current mirrors. The transistors of Mp1, Mpg, Mp5, and Mph are utilized to source the source current, while the transistors Mn7-Mn10 are used to source the sink current. The source and sink currents can subtract each other, where the value subtracted depends on the changing input clock pulse width from the selected clock signal Out-Mux.

When the duty cycle of the selected clock signal Out-Mux is less than 50%, the on duration of the transistor of Mn6 (used here as a switch) is reduced; thereby resulting in reducing the sink current. Thus, the current injected to the oscillator of the DCD is increased that results in the increase of the oscillation frequency. Alternatively, if the duty cycle of the selected clock signal Out-Mux is greater than 50%, the on duration of the transistor Mn6 is reduced that results in reducing the sink current. Thus, the current injected to the oscillator of the DCD is decreased resulting in the reduction of the oscillation frequency.

The current subtraction from $I_{fixed}$ and Ivar to get $I_{sub}$ aids in mitigating the effect of current mismatch made by temperature on the oscillation frequency while its value can be changed gently by varying duty cycle of the input clock signal. The subtracted current is converted to the control voltage Vctrl by using the capacitor C1. The control voltage Vctrl is further coupled to the input of the oscillator 34 of the DCD. To mitigate channel length modulation effect on the PWV converter circuit, long channel length transistors can be utilized in a cascode current mirror. Moreover, additional switches for enabling and disabling via the control signal En-dcd can be employed in the PWV circuit to power it down.

The transistor of Mn6 is placed at the bottom of the serial connections with the source current, the sink current, and the output node 78 to provide for this current subtraction. Thus, when the transistor of Mn6 is off due to the signal Out-Mux being low, transistors of Mn8 and Mn10 can still be in saturation.

If both currents of the PMOS and NMOS transistors have similar value (Ip1 (T)=In2 (T)), then only a current generated by a transistor connected to the input clock can be a dominant parameter. Using a cascode current mirror can further increase output resistance for both sink and source currents (Rout≈$g_m r_o^2$). A defined common mode voltage and improved linearity can be found using such approach. For instance, by subtracting currents (I1–I2), if we have a resistance loading (e.g. a ring oscillator), common mode voltage will be for both cases after adding current variation:

$$Vctrl = Rload(I1-I2+\Delta I1-\Delta I2) \qquad \text{EQ [11]}$$

where Rload is not shown but can be coupled with the output of the PWV converter. Thus the common mode voltage can be more stable against of current variations.

Figure 7:
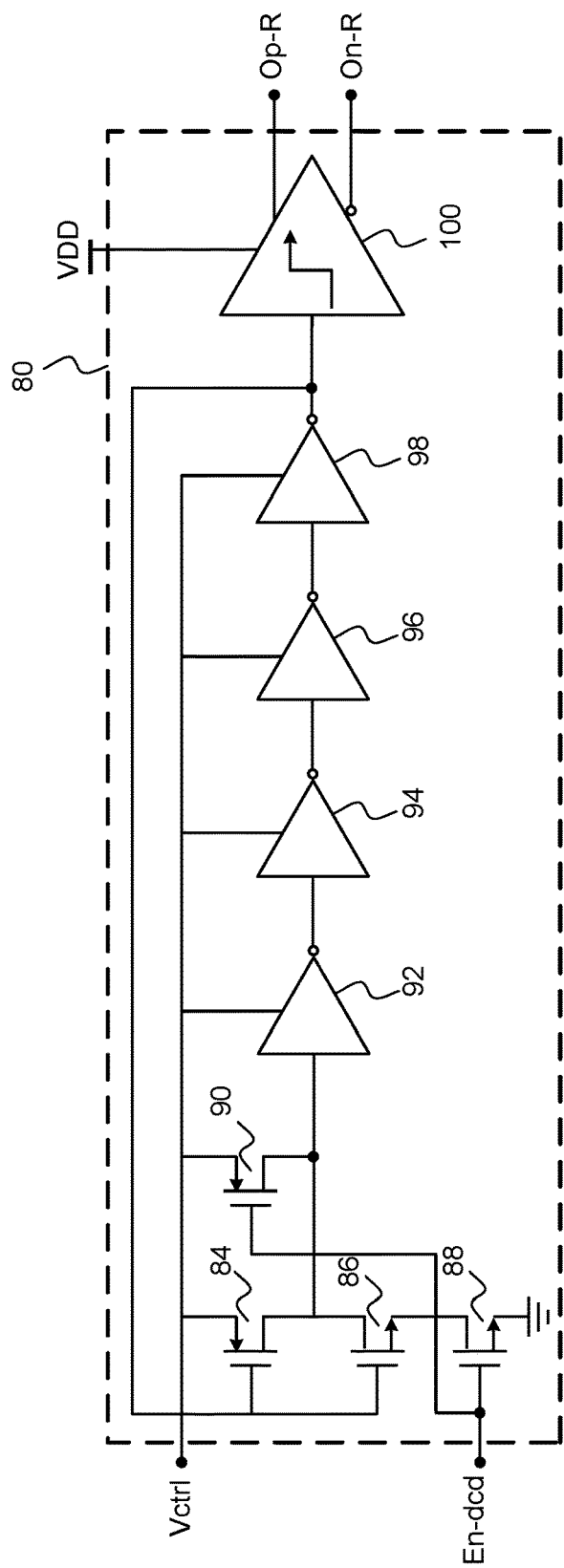
FIG. 7 illustrates a diagram of an oscillator of the present disclosure.

FIG. 7 illustrates a diagram of a ring oscillator of the present disclosure. A ring oscillator of the present disclosure can comprise PMOS transistors 84 and 90 and NMOS transistors 86 and 88, inverters 92-98, and a level shifter 100. The NMOS transistors 84, 86, and 88 are serially connected across an input control voltage Vctrl and ground. The PMOS transistor 90 is coupled across the input control voltage Vctrl and a serial connection between the PMOS transistor 84 and the NMOS transistor 86. The serial connection between the PMOS transistor 84 and the NMOS transistor 86 is also coupled to the input of the inverter 92. The input control voltage Vctrl can power the inverters 92-98. An input enable signal En-dcd is coupled to gates of the NMOS transistor 88 and the PMOS transistor 90. The inverters 92-98 are serially connected. An output of the inverter 98 is coupled to the input of the level shifter 100 and to the gates of the PMOS transistor 84 and the NMOS transistor 86. The level shifter 100 can be powered by the high voltage potential VDD and have a first output Op-R and a second output On-R for generating a differential output.

The control voltage Vctrl, generated by the PWV converter, is used to supply an input signal to the ring oscillator 80. The ring oscillator 80 can be an inverter-based ring oscillator along with a voltage level shifter. In order to power down the DCD, an additional transistor 88 can be included in the oscillator 80. Since the oscillator 80 amplitude output depends on the control voltage Vctrl, which is a value lower than the common voltage supply VDD, the voltage level shifter 100 can be utilized to raise the output value of the oscillator to the common voltage supply VDD. The voltage level shifter 100 is able to convert from the low voltage domain to a high voltage domain and also generate a differential clock signal. It is understood by a person having ordinary skill in the art that other oscillator implementations can be used in conjunction with the present disclosure. The embodiment of a ring oscillator with inverter described herein is only meant for illustrative purposes and in no way meant to limit the present disclosure to such embodiment.

Figure 8:
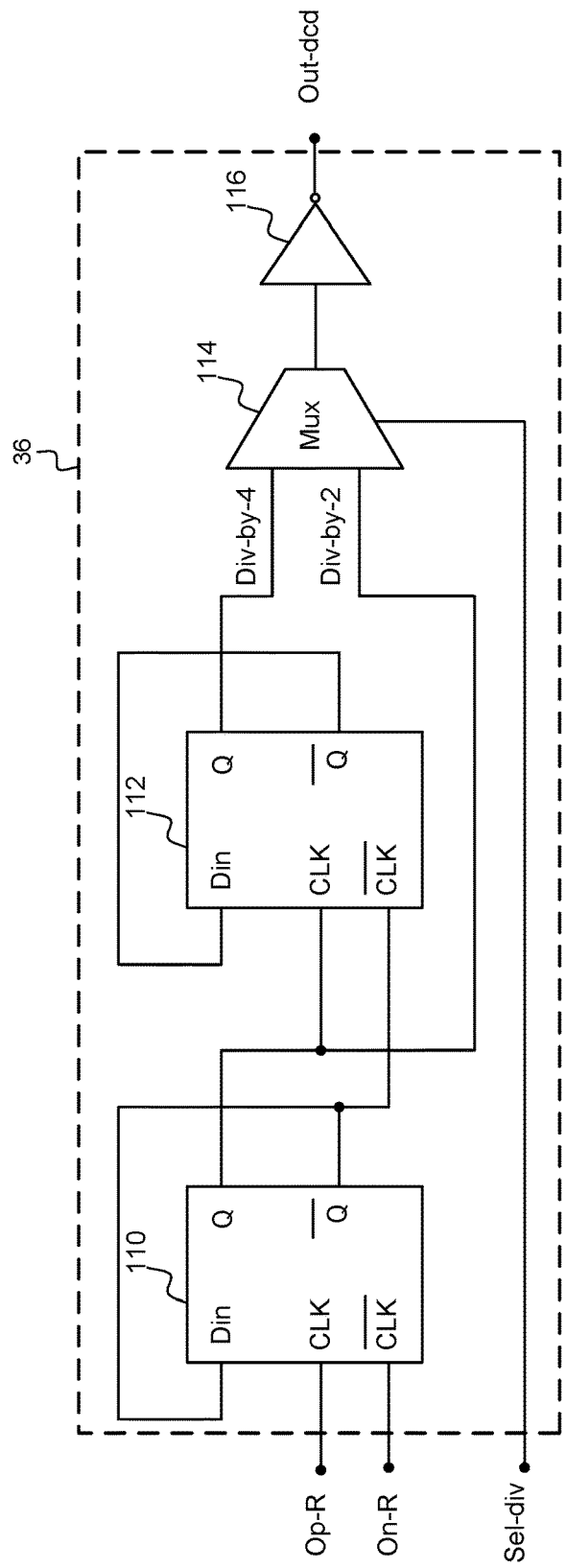
FIG. 8 illustrates a diagram of a divider of the present disclosure.

FIG. 8 illustrates a diagram of divider of the present disclosure. The adjustable divider 36 comprises master-slave flip-flops 110 and 112, a multiplexer 114, and an inverter 116. The differential outputs Op-R and On-R from the ring oscillator can be inputted to the differential clock inputs of the flip-flop 110. Differential outputs Q and $\overline{Q}$ of the flip-flop 110 can be coupled to the differential clock inputs of the flip-flop 112. The differential output Q of the flip-flop 110 can be further coupled to a data input of the flip-flop 110. The differential output Q of the flip-flop 110 is coupled to an input of the mux 114 for providing a divide by two functionality. A differential output Q of the flip-flop 112 is coupled to a data input of the flip-flop 112. Another differential output $\overline{Q}$ of the flip-flop 112 is coupled to another input of the mux 114 for providing a divide by four functionality. A control signal Sel-div can be inputted to the mux 114 for controlling the selection of one of the inputs. The output of the mux 114 is coupled to an input of the inverter 116. The inverter 116 generates an output Out-dcd of the adjustable divider 36. The multiplexer 114 can be used to toggle the frequency division between four and two, (or any other value depending on the implementation of the DCD). It is understood by a person having ordinary skill in the art that other divider implementations can be used in conjunction with the present disclosure. The embodiment of a divider described herein is only meant for illustrative purposes and in no way meant to limit the present disclosure to such embodiment.

Figure 9:
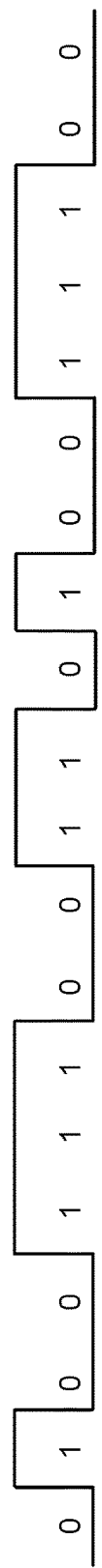
FIG. 9 illustrates a stream of digital bits of a signal.

FIG. 9 illustrates a stream of digital bits of a signal. This pulse width detector can be used in measuring average of bitstreams. For example, a bitstream can be recognized by using a PWV converter of the present disclosure for measuring a pulse width of the bitstream for a given amount of time. The control voltage determined by the PWV converter can then be used to determine the relative number of highs or lows by comparing with an average number as a threshold value.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A pulse-width-to-voltage ("PWV") converter, comprising:
   a switch, wherein the switch is operable by a signal;
   a capacitor;
   a current source; and
   a current sink,
   wherein the current source, the current sink, and the switch are serially connected across a high voltage potential and a low voltage potential,
   wherein an output node is coupled to a serial connection between the current source and the current sink,
   wherein an end of the capacitor is coupled to the output node for converting a current into a control voltage indicative of a duty cycle of the signal,
   wherein the current source comprises serially-connected transistors for generating a fixed reference current, and
   wherein a cascode current mirror is used to bias the serially-connected transistors to generate the fixed current.

2. A pulse-width-to-voltage ("PWV") converter, comprising:
   a switch, wherein the switch is operable by a signal;
   a capacitor;
   a current source; and
   a current sink,
   wherein the current source, the current sink, and the switch are serially connected across a high voltage potential and a low voltage potential,
   wherein an output node is coupled to a serial connection between the current source and the current sink,
   wherein an end of the capacitor is coupled to the output node for converting a current into a control voltage indicative of a duty cycle of the signal,
   wherein the current sink comprises serially-connected transistors for generating a variable current based on switching of the switch, and wherein a cascode current mirror is used to bias the serially-connected transistors to generate the variable current.

3. A duty cycle detector comprising:
a multiplexer;
a pulse-width-voltage converter having:
a switch, wherein the switch is operable by a signal;
a capacitor;
a current source; and
a current sink,
wherein the current source, the current sink, and the switch are serially connected across a high voltage potential and a low voltage potential,
wherein an output node is coupled to a serial connection between the current source and the current sink, and
wherein an end of the capacitor is coupled to the output node for converting a current into a control voltage indicative of a duty cycle of the signal;
a ring oscillator; and
a divider,
wherein inputs of the multiplexer are coupled to a differential clock signal,
wherein an output of the multiplexer is coupled to an input of the PWV converter for generating the signal,
wherein the output node is coupled to an input of the ring oscillator for generating a frequency based on the control voltage, and
wherein an output of the ring oscillator is coupled to an input of the divider for generating a divided signal indicative of the duty cycle of the signal.

4. The duty cycle detector of claim 3 wherein the switch is an n-channel transistor and wherein the signal is coupled to a gate of the n-channel transistor.

5. The duty cycle detector of claim 3 wherein the current source comprises serially-connected transistors for generating a fixed reference current.

6. The duty cycle detector of claim 5 wherein a casocded current mirror is used to bias the serially-connected transistors to generate the fixed current.

7. The duty cycle detector of claim 3 wherein the current sink comprises serially-connected transistors for generating a variable current based on switching of the switch.

8. The duty cycle detector of claim 7 wherein a cascode current mirror is used to bias the serially-connected transistors to generate the variable current.

9. A pulse-width-to-voltage ("PWV") converter, comprising:
a means for switching, wherein the switching is operable by a signal;
a means for converter current to voltage;
a means for generating a current source; and
a means for generating a current sink,
wherein the means for generating current source, the means for generating the current sink, and the means for switching are serially connected across a high voltage potential and a low voltage potential,
wherein an output node is coupled to a serial connection between the means for generating the current source and the means for generating the current sink,
wherein the means for converting the current to voltage is coupled to the output node at the serial connection for generating a voltage output,
wherein the voltage output is indicative of a duty cycle of the signal,
wherein the means for generating the current source comprises serially-connected transistors for generating a fixed reference current, and
wherein a cascode current mirror is used to bias the serially-connected transistors to generate the fixed current.

10. A pulse-width-to-voltage ("PWV") converter, comprising:
a means for switching, wherein the switching is operable by a signal;
a means for converter current to voltage;
a means for generating a current source; and
a means for generating a current sink,
wherein the means for generating current source, the means for generating the current sink, and the means for switching are serially connected across a high voltage potential and a low voltage potential,
wherein an output node is coupled to a serial connection between the means for generating the current source and the means for generating the current sink,
wherein the means for converting the current to voltage is coupled to the output node at the serial connection for generating a voltage output,
wherein the voltage output is indicative of a duty cycle of the signal,
wherein the means for generating the current sink comprises serially-connected transistors for generating a variable current based on switching of the means for switching, and
wherein a cascode current mirror is used to bias the serially-connected transistors to generate the variable current.

* * * * *